United States Patent
Liu (10) Patent No.: US 9,397,138 B2
(45) Date of Patent: Jul. 19, 2016

(54) MANUFACTURING METHOD OF SEMICONDUCTOR STRUCTURE

(71) Applicant: XINTEC INC., Taoyuan (TW)

(72) Inventor: Chien-Hung Liu, New Taipei (TW)

(73) Assignee: XINTEC INC., Taoyuan (TW)

(*) Notice: Subject to any disclaimer, the term of this patent is extended or adjusted under 35 U.S.C. 154(b) by 0 days.

(21) Appl. No.: 14/613,231

(22) Filed: Feb. 3, 2015

(65) Prior Publication Data

US 2015/0279900 A1 Oct. 1, 2015

Related U.S. Application Data

(60) Provisional application No. 61/970,242, filed on Mar. 25, 2014.

(51) Int. Cl.
*H01L 27/146* (2006.01)

(52) U.S. Cl.
CPC .... *H01L 27/14685* (2013.01); *H01L 27/14618* (2013.01); *H01L 27/14687* (2013.01)

(58) Field of Classification Search
CPC ................................................ H01L 27/14627
See application file for complete search history.

(56) References Cited

U.S. PATENT DOCUMENTS

2009/0309212 A1* 12/2009 Shim ...................... H01L 21/568
  257/700
2009/0321863 A1* 12/2009 Borthakur ........... H01L 21/6835
  257/432
2011/0193210 A1* 8/2011 Chien ............... H01L 27/14618
  257/684
2011/0278717 A1* 11/2011 Pagaila ................. H01L 21/568
  257/737

FOREIGN PATENT DOCUMENTS

| TW | 201126676 | 8/2011 |
| TW | 201133727 | 10/2011 |
| TW | 201238026 | 9/2012 |
| TW | 201327732 | 7/2013 |
| TW | 201344889 | 11/2013 |

* cited by examiner

*Primary Examiner* — Caleb Henry
*Assistant Examiner* — Mounir Amer
(74) *Attorney, Agent, or Firm* — Liu & Liu (57) ABSTRACT

A manufacturing method of a semiconductor structure includes the following steps. A carrier and a dam element are provided, and the dam element is adhered to the carrier by a temporary bonding layer. The dam element is bonded on the wafer. A first isolation layer, a redistribution layer, a second isolation layer, and a conductive structure are formed on the wafer in sequence. The carrier, the dam element and the wafer are diced to form a semiconductor element. The semiconductor element is disposed on a printed circuit board, such that the conductive structure is electrically connected to the printed circuit board. An adhesion force of the temporary bonding layer is eliminated to remove the carrier. A lens assembly is disposed on the printed circuit board, such that the semiconductor element without the carrier is located in the lens assembly.

12 Claims, 13 Drawing Sheets

A carrier and a dam element are provided, and a first surface of the dam element is adhered to the carrier by a temporary bonding layer. — S1

A second surface of the dam element opposite to the first surface is bonded to a third surface of a wafer, such that an image sensing area of the wafer is between the carrier and the dam element. — S2

A first isolation layer, a redistribution layer, a second isolation layer, and a conductive structure are formed in sequence on a fourth surface of the wafer opposite to the third surface. — S3

The carrier, the dam element, and the wafer are diced to form a semiconductor element. — S4

The semiconductor element is disposed on a printed circuit board, such that the conductive structure is electrically connected to the printed circuit board. — S5

An adhesion force of the temporary bonding layer is eliminated to remove the carrier. — S6

A lens assembly is disposed on the printed circuit board, such that the semiconductor element without the carrier is located in the lens assembly, and a light transmissive member of the lens assembly is aligned with the image sensing area. — S7

MANUFACTURING METHOD OF SEMICONDUCTOR STRUCTURE

RELATED APPLICATIONS

This application claims priority to U.S. provisional Application Ser. No. 61/970,242, filed Mar. 25, 2014, which is herein incorporated by reference.

BACKGROUND

1. Field of Invention

The present invention relates to a manufacturing method of a semiconductor structure.

2. Description of Related Art

In manufacturing an image sensor chip (e.g., a CMOS chip), a glass sheet is often used to cover a surface of a wafer for protecting the wafer from the attachment of dust to the image sensing area of the wafer. For a chip from dicing the wafer and used in an electronic product, a housing of the electronic product aligned with the chip usually has been disposed with a light transmissive that exhibits similar protection function to that of the glass sheet on the surface of the chip. Therefore, it is not only economically inefficient in the cost but also results in reduction to light transmittance.

However, for the surface of the wafer without the glass sheet, although the light transmittance may be improved and the image sensing capability of the chip from dicing the wafer is thus enhanced, the thickness of the wafer becomes so thin that it is very difficult to move the wafer along with ball grid arrays thereon.

Moreover, if the image sensing area is not protected by any elements in a manufacturing process of an image sensor, the image sensing area is vulnerable to dust pollution, which causes yield loss. For example, when the image sensor is fixed on a printed circuit board through a reflow oven, the image sensing area not covered by a glass sheet would be seriously polluted. Alternatively, the image sensor without a glass sheet needs to be manufactured in a high-grade clean room that increases manufacturing cost.

SUMMARY

An aspect of the present invention is to provide a manufacturing method of a semiconductor structure.

According to an embodiment of the present invention, a manufacturing method of a semiconductor structure includes the following steps. (a) A carrier and a dam element are provided, and a first surface of the dam element is adhered to the carrier by a temporary bonding layer. (b) A second surface of the dam element opposite to the first surface is bonded to a third surface of a wafer, such that an image sensing area of the wafer is between the carrier and the dam element. (c) A first isolation layer, a redistribution layer, a second isolation layer, and a conductive structure are formed in sequence on a fourth surface of the wafer opposite to the third surface. (d) The carrier, the dam element, and the wafer are diced to form a semiconductor element. (e) The semiconductor element is disposed on a printed circuit board, such that the conductive structure is electrically connected to the printed circuit board. (f) An adhesion force of the temporary bonding layer is eliminated to remove the carrier. (g) A lens assembly is disposed on the printed circuit board, such that the semiconductor element without the carrier is located in the lens assembly, and a light transmissive member of the lens assembly is aligned with the image sensing area.

In the aforementioned embodiments of the present invention, the carrier may provides a supporting force for the wafer, such that the wafer is not easily broken when the first isolation layer, the redistribution layer, the second isolation layer, and the conductive structure are formed on the wafer. Moreover, the carrier may protect the image sensing area of the wafer. When the carrier, the dam element, and the wafer are diced and when the semiconductor element is disposed on the printed circuit board, the carrier prevents the image sensing area from being polluted. Since the dam element is adhered to the carrier by the temporary bonding layer, the carrier may be removed after the conductive structure is electrically connected to the printed circuit board. As a result, the detecting capability of the image sensing area may be improved due to the semiconductor element without carrier in the lens assembly, and the cost of a glass sheet that is disposed on a typical chip is saved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
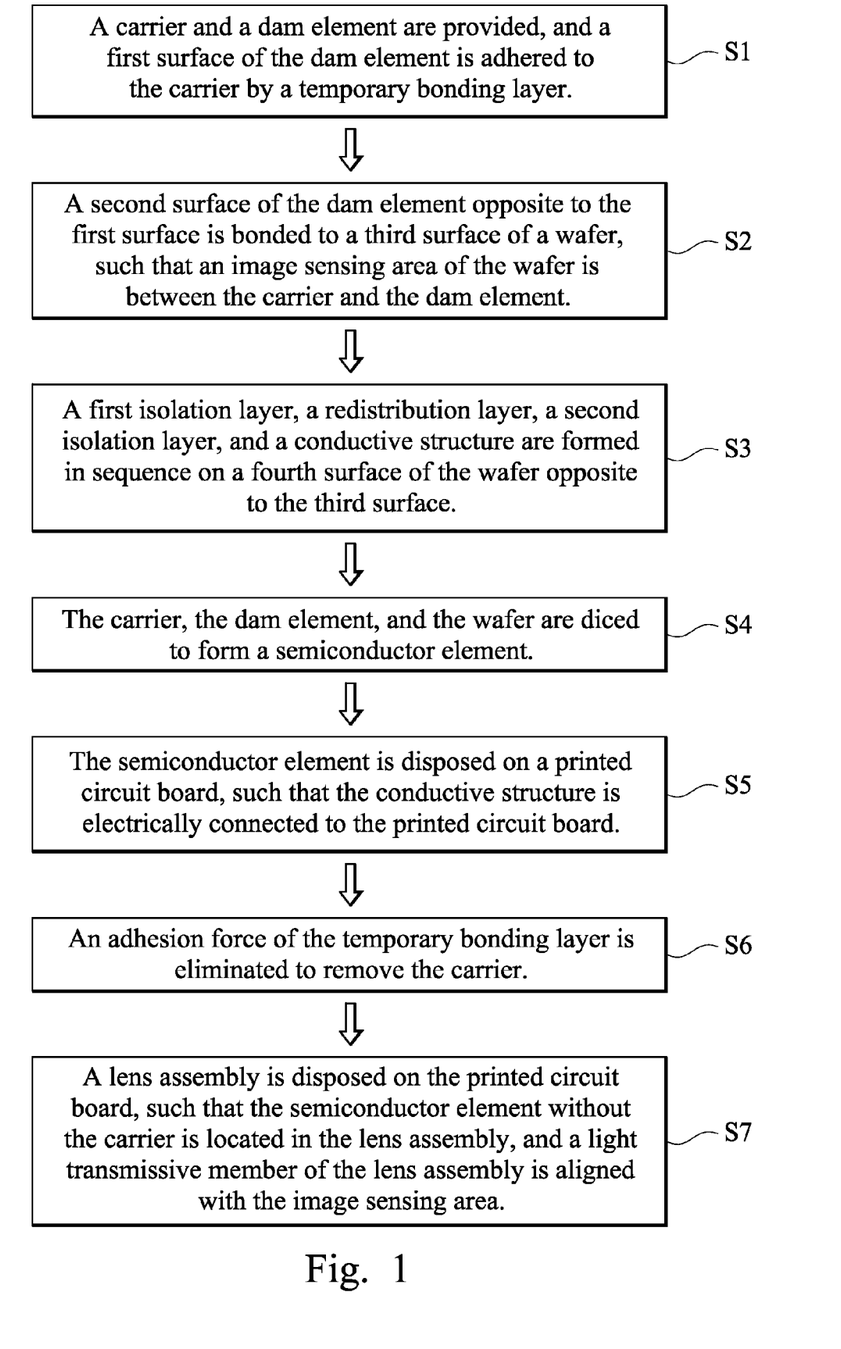
FIG. 1 is a flow chart of a manufacturing method of a semiconductor structure according to one embodiment of the present invention.

FIG. 1 is a flow chart of a manufacturing method of a semiconductor structure according to one embodiment of the present invention. In step S1, a carrier and a dam element are provided, and a first surface of the dam element is adhered to the carrier by a temporary bonding layer. Thereafter in step S2, a second surface of the dam element opposite to the first surface is bonded to a third surface of a wafer, such that an image sensing area of the wafer is between the carrier and the dam element. Next, in step S3, a first isolation layer, a redistribution layer, a second isolation layer, and a conductive structure are formed in sequence on a fourth surface of the wafer opposite to the third surface. Then in step S4, the carrier, the dam element, and the wafer are diced to form a semiconductor element. Thereafter in step S5, the semiconductor element is disposed on a printed circuit board, such that the conductive structure is electrically connected to the printed circuit board. Next in step S6, an adhesion force of the temporary bonding layer is eliminated to remove the carrier. Finally in step S7, a lens assembly is disposed on the printed circuit board, such that the semiconductor element without the carrier is located in the lens assembly, and a light transmissive member of the lens assembly is aligned with the image sensing area. In the following description, each of the aforesaid steps will be described.

Figure 2:
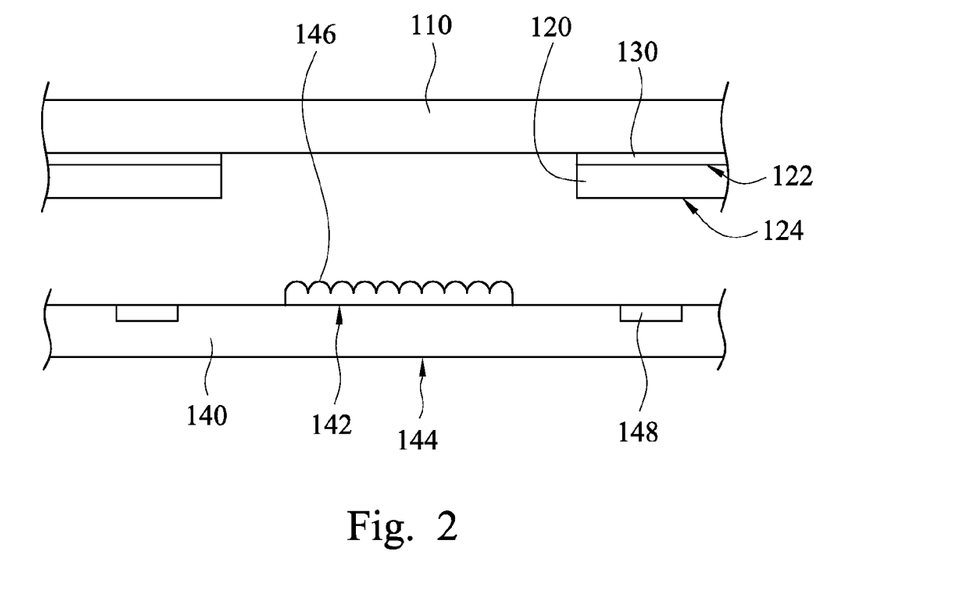
FIG. 2 is a schematic view of a dam element when being adhered to a wafer.
Figure 3:
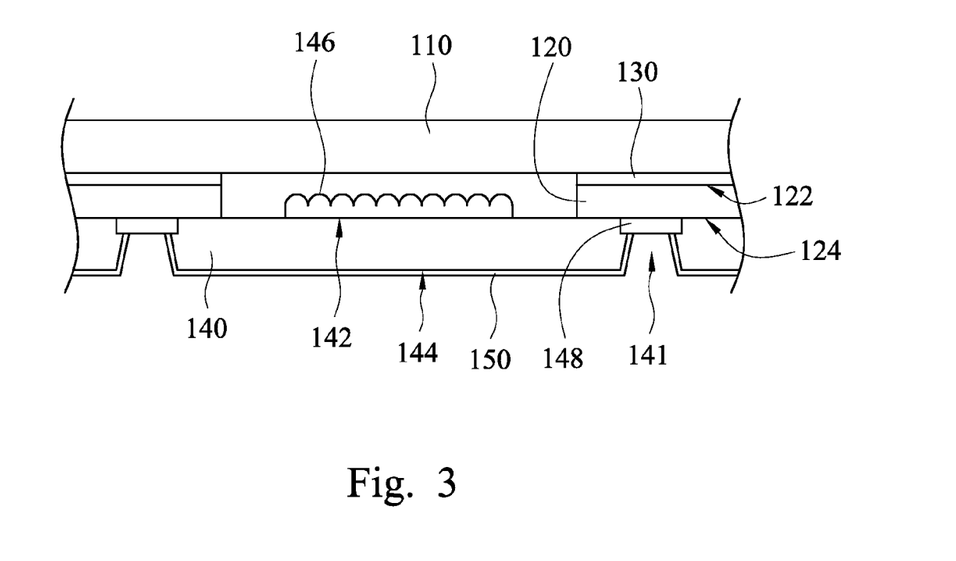
FIG. 3 is a schematic view of a concave hole and a first isolation layer after being formed on the wafer shown in FIG. 2.

FIG. 2 is a schematic view of a dam element 120 when being adhered to a wafer 140. FIG. 3 is a schematic view of a concave hole 141 and a first isolation layer 150 after being formed on the wafer 140 shown in FIG. 2. As shown in FIG. 2 and FIG. 3, the dam element 120 has a first surface 122 and a second surface 124 opposite to the first surface 122. The wafer 140 has a third surface 142 and a fourth surface 144 opposite to the third surface 142. The first surface 122 of the dam element 120 is adhered to the carrier 110 by a temporary bonding layer 130. Thereafter, the second surface 124 of the dam element 120 that is adhered to the carrier 110 may be bonded to the third surface 142 of the wafer 140, such that an image sensing area 146 of the wafer 140 is between the carrier 110 and the dam element 120. That is to say, the image sensing area 146 is covered and protected by the carrier 110.

After the dam element 120 is bonded to the wafer 140, a concave hole 141 may be formed in the fourth surface 144 of the wafer 140. Afterwards, the patterned first isolation layer 150 may be formed on the fourth surface 144 of the wafer 140 and a side wall of the concave hole 141. The patterned first isolation layer 150 does not cover an electrical pad 148 of the wafer 140, such that the electrical pad 148 is exposed through the concave hole 141 and the first isolation layer 150.

Figure 4:
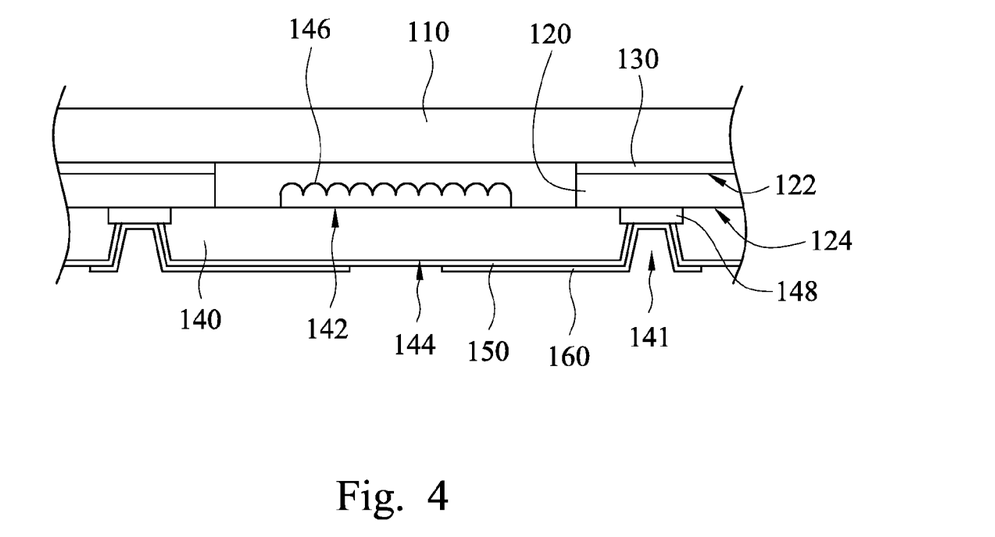
FIG. 4 is a schematic view of a redistribution layer after being formed on the first isolation layer and an electrical pad shown in FIG. 3.

FIG. 4 is a schematic view of a redistribution layer 160 (RDL) after being formed on the first isolation layer 150 and the electrical pad 148 shown in FIG. 3. After the first isolation layer 150 is formed on the wafer 140, the patterned redistribution layer 160 may be formed on the first isolation layer 150 and the electrical pad 148, such that the redistribution layer 160 is electrically connected to the electrical pad 148. Furthermore, open circuits may be formed between the electrical pads 148 due to the patterned redistribution layer 160, and the patterned redistribution layer 160 prevents the electrical pads 148 from conducting to cause short circuits.

Figure 5:
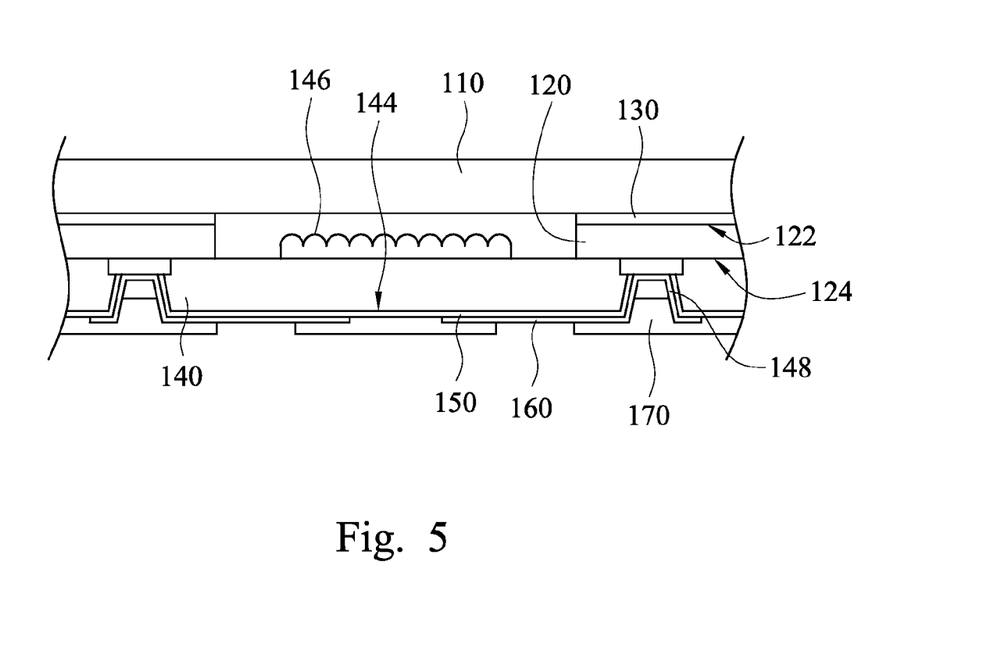
FIG. 5 is a schematic view of a second isolation layer after being formed on the redistribution layer shown in FIG. 4.
Figure 6:
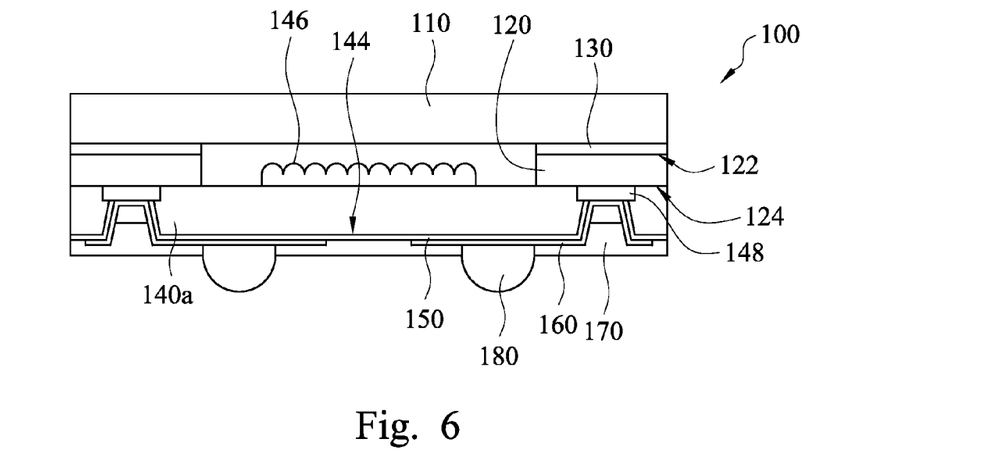
FIG. 6 is a schematic view of a conductive structure after being formed on the exposed redistribution layer shown in FIG. 5.

FIG. 5 is a schematic view of a second isolation layer 170 after being formed on the redistribution layer 160 shown in FIG. 4. FIG. 6 is a schematic view of a conductive structure 180 after being formed on the exposed redistribution layer 160 shown in FIG. 5. As shown in FIG. 5 and FIG. 6, after the redistribution layer 160 is formed on the first isolation layer 150 and the electrical pad 148, the patterned second isolation layer 170 may be formed on the redistribution layer 160. A portion of the redistribution layer 160 is exposed through the patterned second isolation layer 170. Thereafter, the conductive structure 180 may be formed on the exposed redistribution layer 160, such that the conductive structure 180 is electrically connected to the electrical pad 148 through the redistribution layer 160. As a result, the first isolation layer 150, the redistribution layer 160, the second isolation layer 170, and the conductive structure 180 are formed in sequence on the fourth surface 144 of the wafer 140.

In this embodiment, the concave hole 141 of the wafer 140 may be formed by an etching process. The carrier 110 may be, but not limited to a glass plate. The wafer 140 may be made of a material including silicon, such as a silicon substrate. The carrier 110 may provide a supporting force for the wafer 140. The redistribution layer 160 may be made of a material including aluminum, copper, or other conductive materials. The first isolation layer 150 may be nonmetal oxides, nonmetal nitride, or epoxy. The second isolation layer 170 may be a solder mask. The conductive structure 180 may be a conductive protrusion or a solder ball of ball grid array (BGA).

After the conductive structure 180 is formed on the redistribution layer 160, the carrier 110, the dam element 120, and the wafer 140 may be diced in a vertical direction to form a semiconductor element 100, as shown in FIG. 6. After the wafer 140 is diced, plural chips 140a will be formed. That is to say, the chip 140a is referred to as a piece of the diced wafer 140. The chip 140a may be am image sensing chip, such as a front side illumination (FSI) CMOS image sensing chip or a backside illumination (BSI) CMOS image sensing chip. In the following description, the semiconductor element 100 having the chip 140a will be described.

Figure 7:
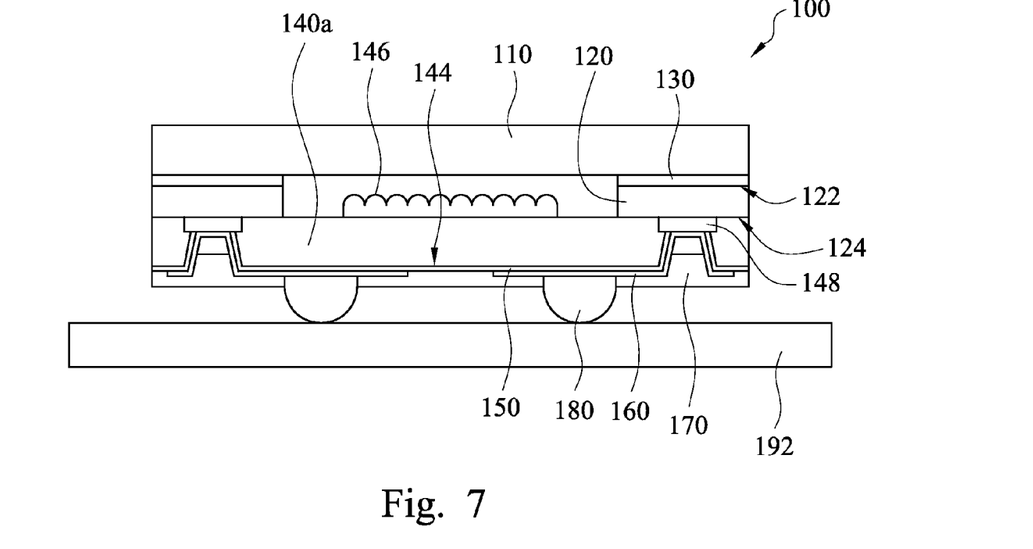
FIG. 7 is a schematic view of a semiconductor element shown in FIG. 6 after being disposed on a printed circuit board.
Figure 8:
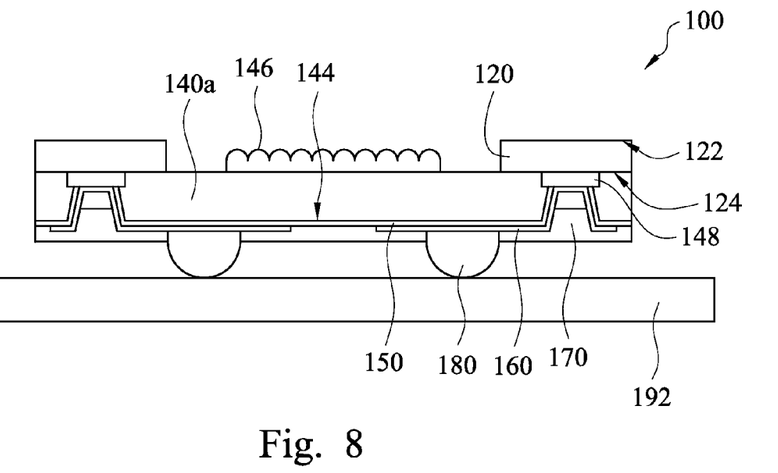
FIG. 8 is a schematic view of the semiconductor element shown in FIG. 7 after a carrier is removed.

FIG. 7 is a schematic view of the semiconductor element 100 shown in FIG. 6 after being disposed on a printed circuit board 192. FIG. 8 is a schematic view of the semiconductor element 100 shown in FIG. 7 after the carrier 110 is removed. As shown in FIG. 7 and FIG. 8, after the semiconductor element 100 is formed, the semiconductor element 100 may be disposed on the printed circuit board 192 through surface mount technology (SMT), such that the conductive structure 180 is electrically connected to the printed circuit board 192. SMT may be performed in a reflow oven. Although polluting particles may be formed in a SMT process, the image sensing area 146 is not be polluted due to the carrier 110 covers the image sensing area 146. Afterwards, the adhesion force of the temporary bonding layer 130 may be eliminated to remove the carrier 110 that is on the dam element 120. A heating process, an ultraviolet irradiation process, a laser process, a chemical immersion process, and a mechanical process may be selectively used to eliminate the adhesion force of the temporary bonding layer 130, but the present invention is not limited in this regard.

Figure 9:
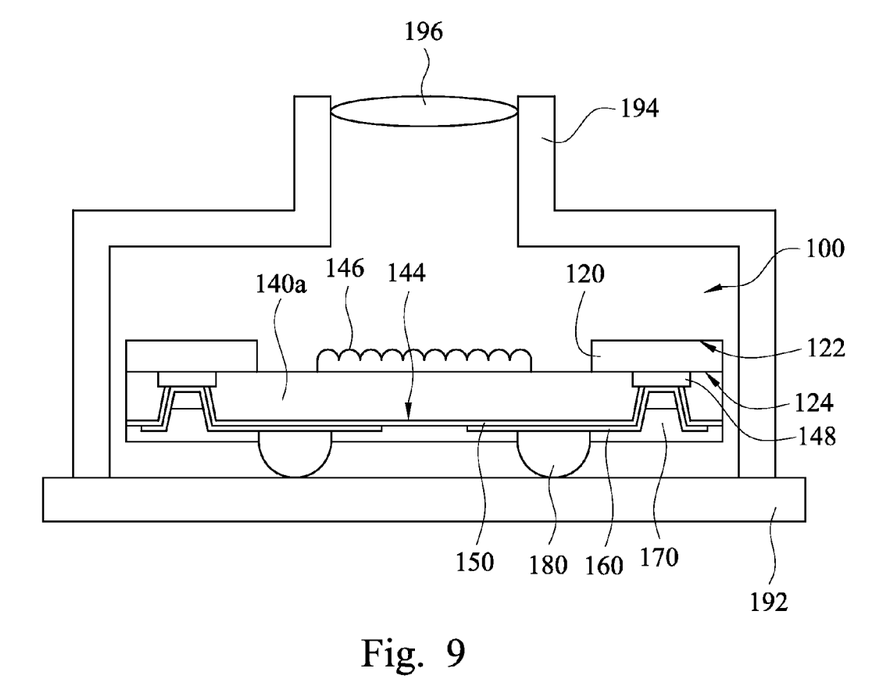
FIG. 9 is a schematic view of a lens assembly after being disposed on the printed circuit board shown in FIG. 8.

FIG. 9 is a schematic view of a lens assembly 194 after being disposed on the printed circuit board 192 shown in FIG. 8. The lens assembly 194 has a light transmissive member 196. After the carrier 110 (see FIG. 7) is removed from the semiconductor element 100, the lens assembly 194 may be disposed on the printed circuit board 192, such that the semiconductor element 100 without the carrier 110 is located in the lens assembly 194, and the light transmissive member 196 of the lens assembly 194 is aligned with the image sensing area 146 of the chip 140a.

Compared with the manufacturing method of the semiconductor structure and the prior art, the carrier may provides a supporting force for the wafer, such that the wafer is not easily broken when the first isolation layer, the redistribution layer, the second isolation layer, and the conductive structure are formed on the wafer. Moreover, the carrier may protect the image sensing area of the wafer. When the carrier, the dam element, and the wafer are diced and when the semiconductor element is disposed on the printed circuit board, the carrier prevents the image sensing area from being polluted. Since the dam element is adhered to the carrier by the temporary bonding layer, the carrier may be removed after the conductive structure is electrically connected to the printed circuit board. As a result, the detecting capability of the image sensing area may be improved due to the semiconductor element without carrier in the lens assembly, and the cost of a glass sheet that is disposed on a typical chip is saved.

It is to be noted that the connection relationships, the materials, and the utility of the elements described above will not be repeated in the following description. In the following description, a manufacturing method of another semiconductor structure will be described.

Figure 10:
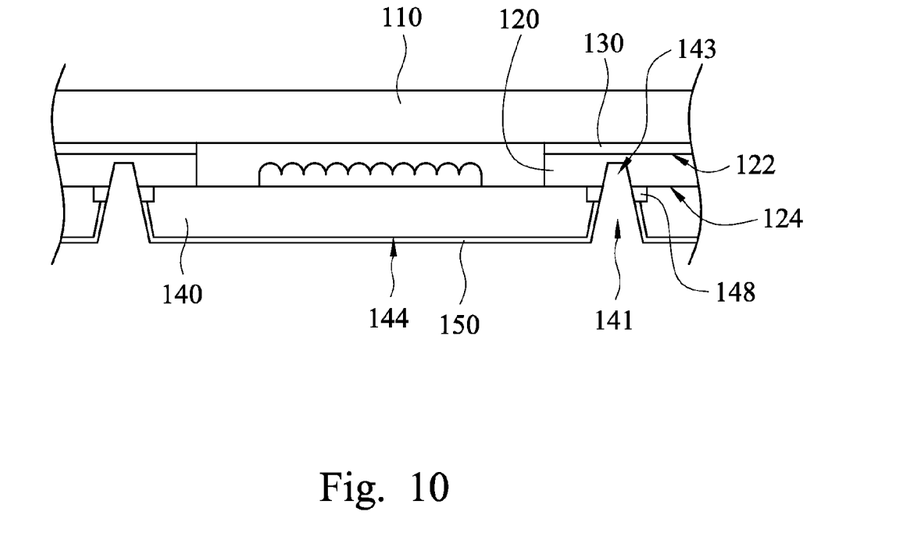
FIG. 10 is a schematic view of a sub concave hole after being formed in the electrical pad and the dam element shown in FIG. 3.

FIG. 10 is a schematic view of a sub concave hole 143 after being formed in the electrical pad 148 and the dam element 120 shown in FIG. 3. In this embodiment, a manufacturing method of a semiconductor structure includes the steps of FIG. 2 and FIG. 3, and will not be repeated. As shown in FIG. 3 and FIG. 10, after the first isolation layer 150 is formed on the fourth surface 144 of the wafer 140 and the side wall of the concave hole 141, the sub concave hole 143 that is communicated with the concave hole 141 may be formed in the electrical pad 148 and the dam element 120. The sub concave hole 143 may be formed by drilling the electrical pad 148 and the dam element 120.

Figure 11:
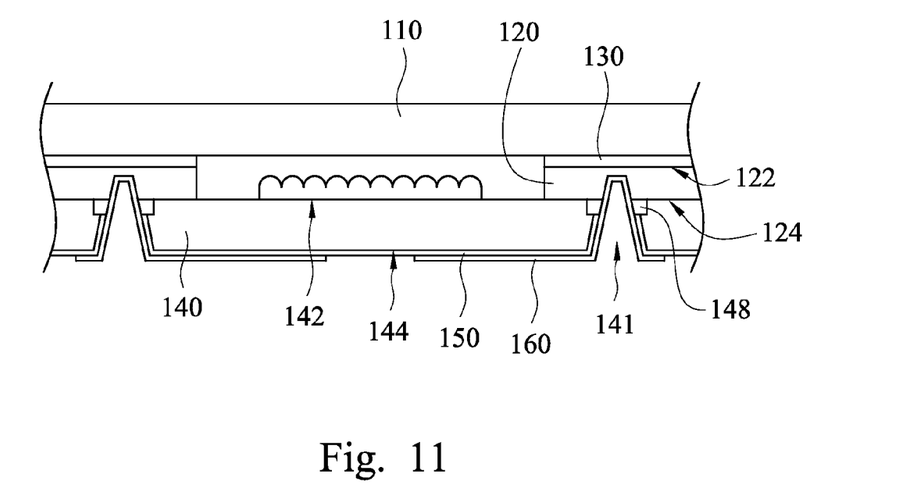
FIG. 11 is a schematic view of the redistribution layer after being formed on the first isolation layer, the electrical pad, and the dam element shown in FIG. 10.

FIG. 11 is a schematic view of the redistribution layer 160 after being formed on the first isolation layer 150, the electrical pad 148, and the dam element 120 shown in FIG. 10. After the sub concave hole 143 is formed, the patterned redistribution layer 160 may be formed on the first isolation layer 150, the electrical pad 148 and the dam element 120, such that the redistribution layer 160 is electrically connected to the electrical pad 148.

Figure 12:
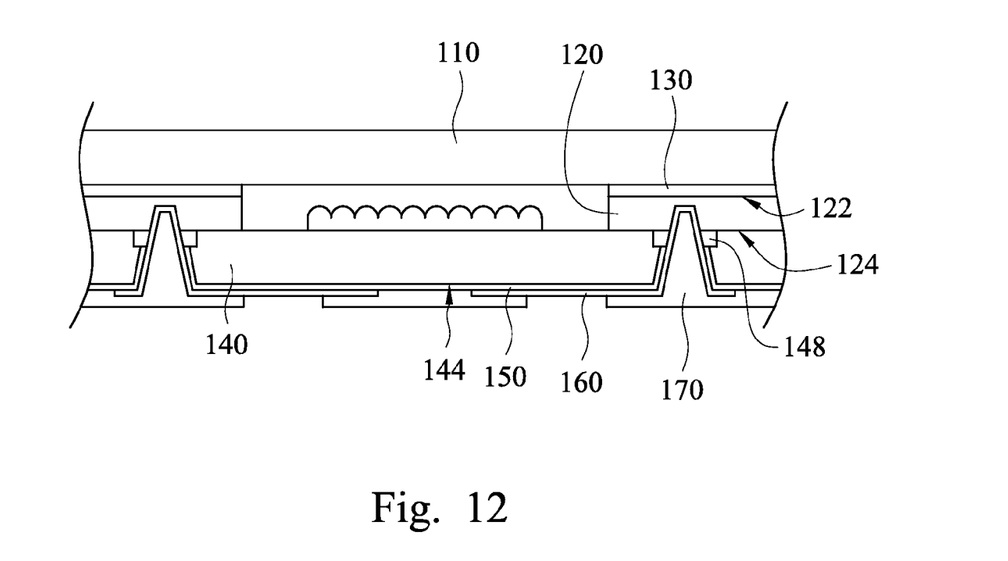
FIG. 12 is a schematic view of the second isolation layer after being formed on the redistribution layer shown in FIG. 11.
Figure 13:
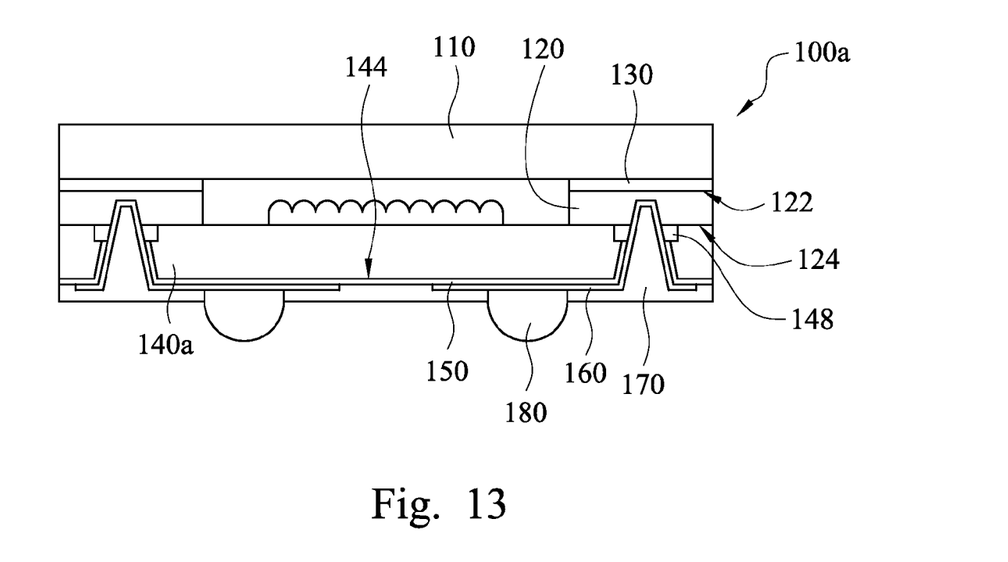
FIG. 13 is a schematic view of the conductive structure after being formed on the exposed redistribution layer shown in FIG. 12.

FIG. 12 is a schematic view of the second isolation layer 170 after being formed on the redistribution layer 160 shown in FIG. 11. FIG. 13 is a schematic view of the conductive structure 180 after being formed on the exposed redistribution layer 160 shown in FIG. 12. As shown in FIG. 12 and FIG. 13, after the redistribution layer 160 is formed on the first isolation layer 150, the electrical pad 148, and the dam element 120, the patterned second isolation layer 170 may be formed on the redistribution layer 160. A portion of the redistribution layer 160 is exposed through the patterned second isolation layer 170. Thereafter, the conductive structure 180 may be formed on the exposed redistribution layer 160, such that the conductive structure 180 is electrically connected to the electrical pad 148 through the redistribution layer 160. As a result, the first isolation layer 150, the redistribution layer 160, the second isolation layer 170, and the conductive structure 180 are formed in sequence on the fourth surface 144 of the wafer 140.

After the conductive structure 180 is formed on the redistribution layer 160, the carrier 110, the dam element 120, and the wafer 140 may be diced in a vertical direction to form a semiconductor element 100a, as shown in FIG. 13. In the following description, the semiconductor element 100a having the chip 140a will be described.

Figure 14:
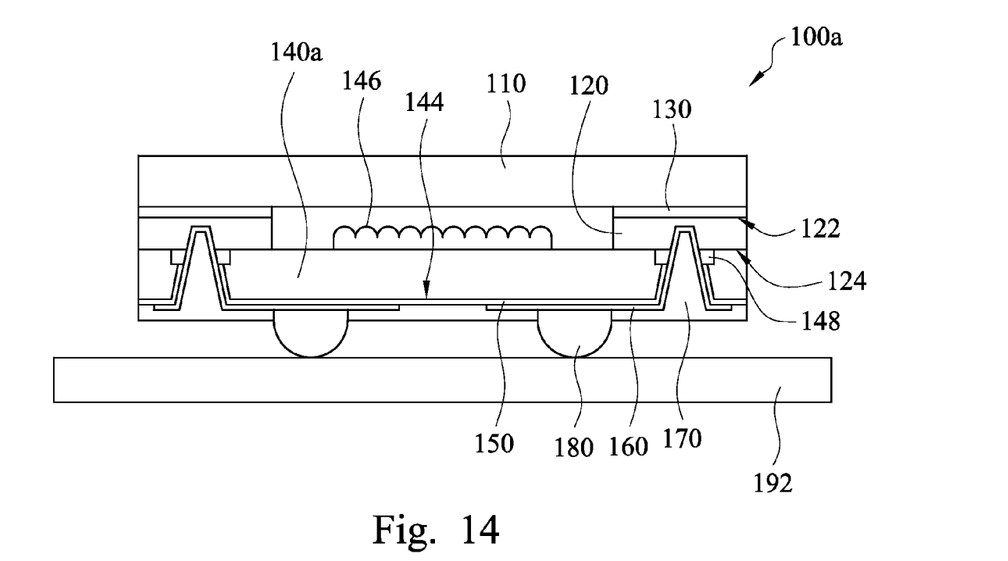
FIG. 14 is a schematic view of the semiconductor element shown in FIG. 13 after being disposed on the printed circuit board.
Figure 15:
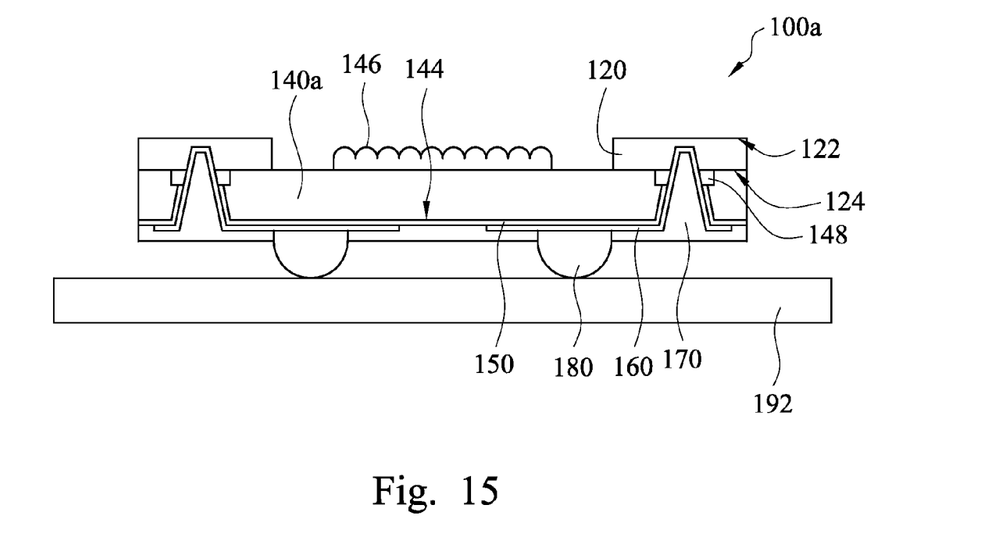
FIG. 15 is a schematic view of the semiconductor element shown in FIG. 14 after the carrier is removed.

FIG. 14 is a schematic view of the semiconductor element 100a shown in FIG. 13 after being disposed on the printed circuit board 192. FIG. 15 is a schematic view of the semiconductor element 100a shown in FIG. 14 after the carrier 110 is removed. As shown in FIG. 14 and FIG. 15, after the semiconductor element 100a is formed, the semiconductor element 100a may be disposed on the printed circuit board 192 through SMT, such that the conductive structure 180 is electrically connected to the printed circuit board 192. SMT may be performed in a reflow oven. Although polluting particles may be formed in a SMT process, the image sensing area 146 is not be polluted due to the carrier 110 covers the image sensing area 146. Afterwards, the adhesion force of the temporary bonding layer 130 may be eliminated to remove the carrier 110 that is on the dam element 120.

Figure 16:
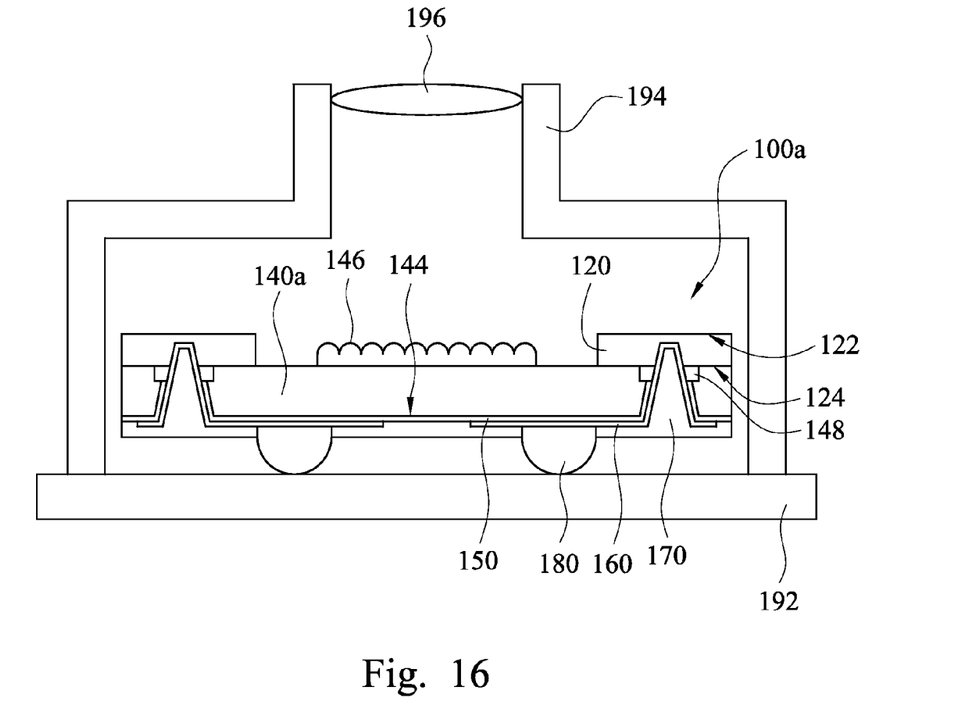
FIG. 16 is a schematic view of the lens assembly after being disposed on the printed circuit board shown in FIG. 15.

FIG. 16 is a schematic view of the lens assembly 194 after being disposed on the printed circuit board 192 shown in FIG. 15. The lens assembly 194 has the light transmissive member 196. After the carrier 110 (see FIG. 14) is removed from the semiconductor element 100a, the lens assembly 194 may be disposed on the printed circuit board 192, such that the semiconductor element 100a without the carrier 110 is located in the lens assembly 194, and the light transmissive member 196 of the lens assembly 194 is aligned with the image sensing area 146 of the chip 140a.

In the following description, a manufacturing method of another semiconductor structure will be described.

Figure 17:
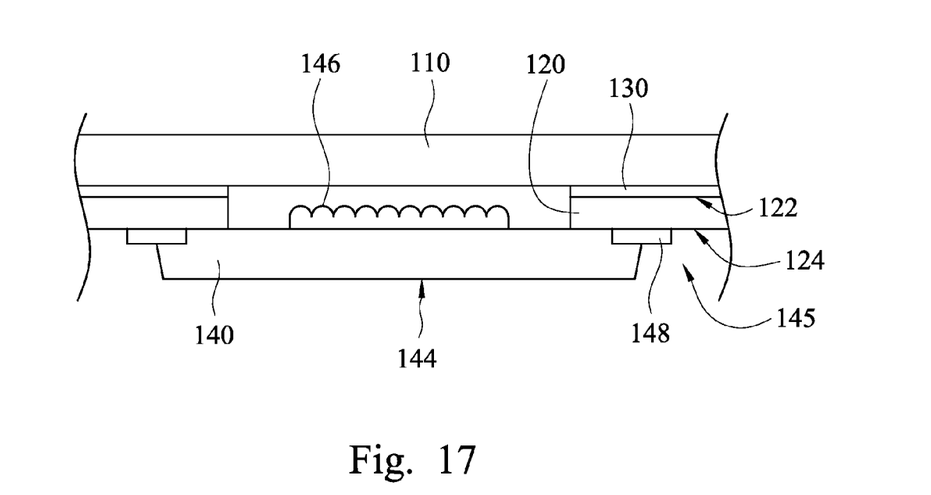
FIG. 17 is a schematic view of the dam element shown in FIG. 2 after being adhered to the wafer and after a recess is formed in the wafer.

FIG. 17 is a schematic view of the dam element 120 shown in FIG. 2 after being adhered to the wafer 140 and after a recess 145 is formed in the wafer 140. In this embodiment, a manufacturing method of a semiconductor structure includes the step of FIG. 2, and will not be repeated. As shown in FIG. 2 and FIG. 17, after the second surface 124 of the dam element 120 is bonded to the third surface 142 of the wafer 140, the wafer 140 may be etched to form the recess 142, such that the side wall of the electrical pad 148 of the wafer 140 is exposed through the recess 145.

Figure 18:
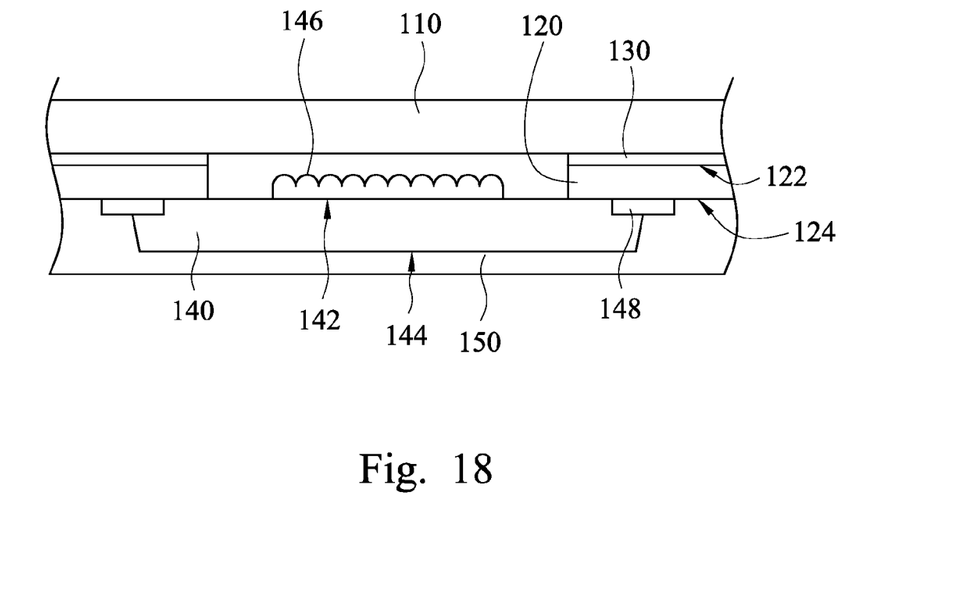
FIG. 18 is a schematic view of the first isolation layer after being formed on the wafer and the electrical pad shown in FIG. 17.

FIG. 18 is a schematic view of the first isolation layer 150 after being formed on the wafer 140 and the electrical pad 148 shown in FIG. 17. After the side wall of the electrical pad 148 of the wafer 140 is exposed through the recess 145, the first isolation layer 150 may be formed on the fourth surface 144 of the wafer 140 and the side wall of the electrical pad 148. In this embodiment, the first isolation layer 150 may be, but not limited to a solder mask.

Figure 19:
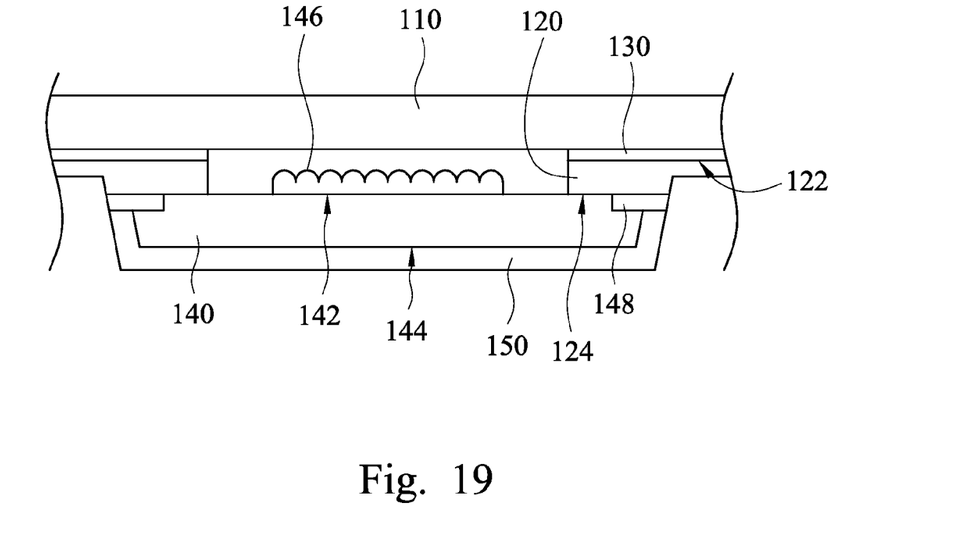
FIG. 19 is a schematic view of a portion of the first isolation layer shown in FIG. 18 after being cut and removed.
Figure 20:
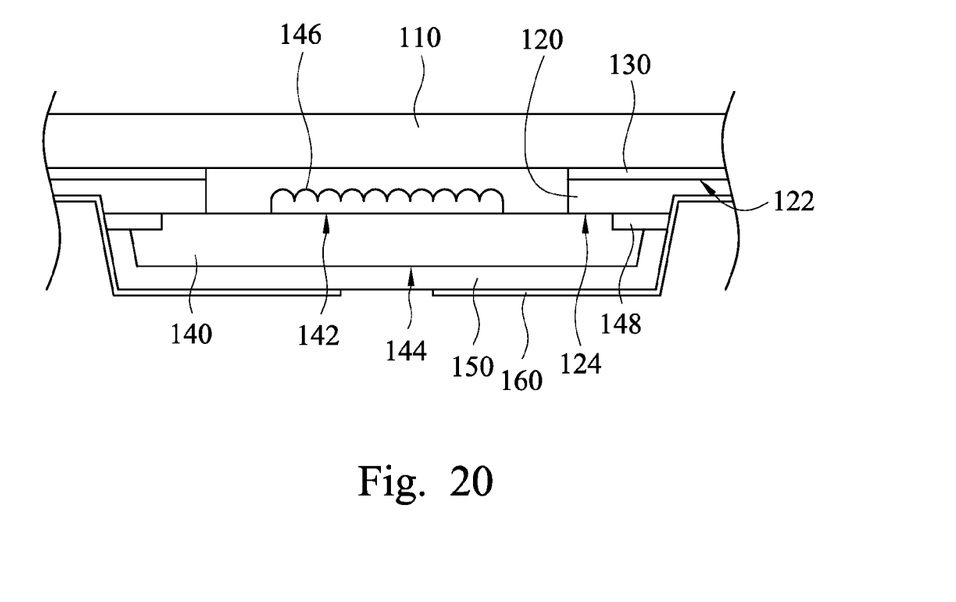
FIG. 20 is a schematic view of the redistribution layer after being formed on the first isolation layer and the electrical pad shown in FIG. 19.

FIG. 19 is a schematic view of a portion of the first isolation layer 150 shown in FIG. 18 after being cut and removed. FIG. 20 is a schematic view of the redistribution layer 160 after being formed on the first isolation layer 150 and the electrical pad 148 shown in FIG. 19. As shown in FIG. 19 and FIG. 20, after the first isolation layer 150 is formed on the fourth surface 144 of the wafer 140 and the side wall of the electrical pad 148, a portion of the first isolation layer 150 and a portion of the dam element 120 that cover the side wall of the electrical pad 148 may be cut and removed to expose the side wall of the electrical pad 148. Thereafter, the patterned redistribution layer 160 may be formed on the first isolation layer 150, the dam element 120, and the side wall of the electrical pad 148, such that the redistribution layer 160 is electrically connected to the electrical pad 148, as shown in FIG. 20.

Figure 21:
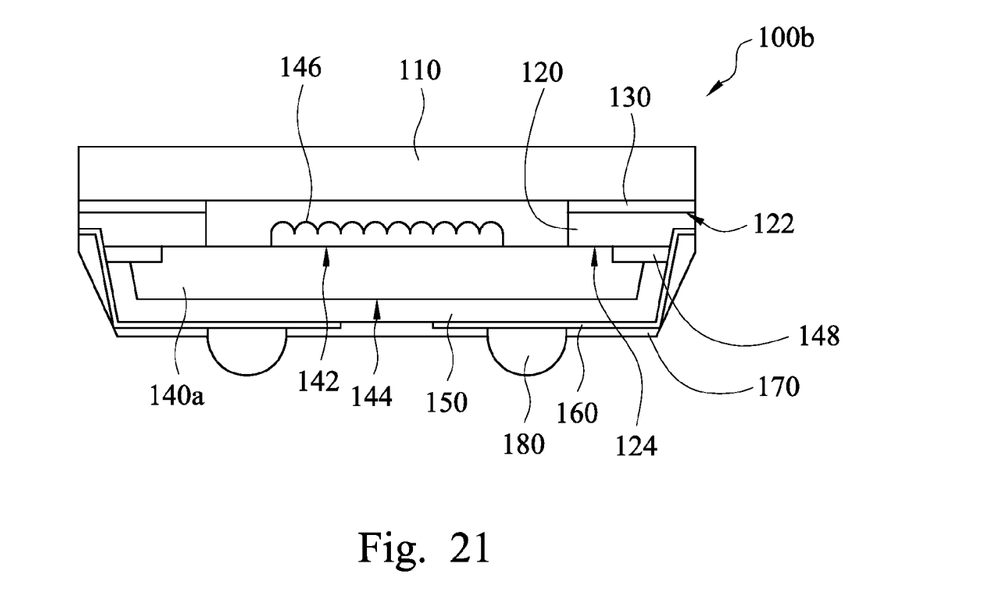
FIG. 21 is a schematic view of the second isolation layer after being formed on the redistribution layer shown in FIG. 20 and the conductive structure after being formed on the exposed redistribution layer.

FIG. 21 is a schematic view of the second isolation layer 170 after being formed on the redistribution layer 160 shown in FIG. 20 and the conductive structure 180 after being formed on the exposed redistribution layer 160. As shown in FIG. 20 and FIG. 21, after the redistribution layer 160 is formed on first isolation layer 150, the dam element 120, and the side wall of the electrical pad 148, the patterned second isolation layer 170 may be formed on the redistribution layer 160. A portion of the redistribution layer 160 is exposed through the patterned second isolation layer 170. Thereafter, the conductive structure 180 may be formed on the exposed redistribution layer 160, such that the conductive structure 180 is electrically connected to the electrical pad 148 through the redistribution layer 160.

After the conductive structure 180 is formed on the redistribution layer 160, the carrier 110, the dam element 120, and the wafer 140 may be diced in a vertical direction to form a semiconductor element 100b, as shown in FIG. 21. In the following description, the semiconductor element 100b having the chip 140a will be described.

Figure 22:
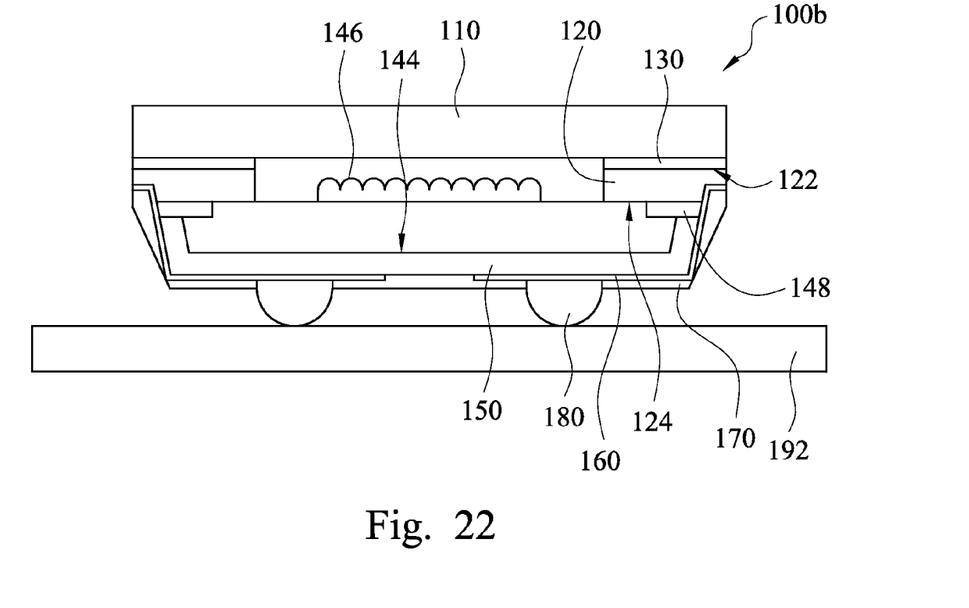
FIG. 22 is a schematic view of the semiconductor element shown in FIG. 21 after being disposed on the printed circuit board.
Figure 23:
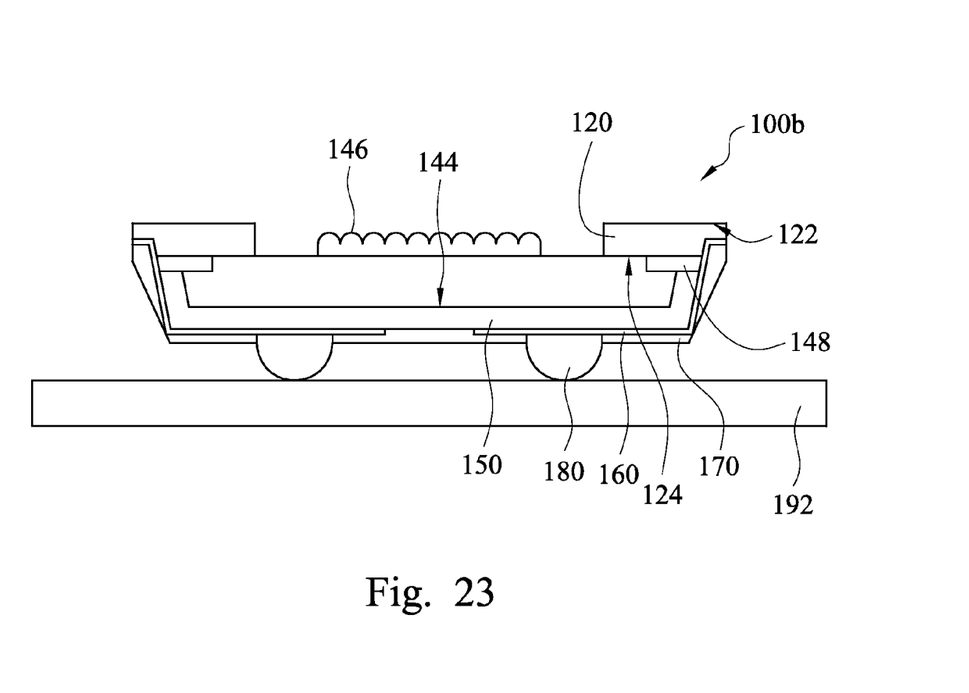
FIG. 23 is a schematic view of the semiconductor element shown in FIG. 22 after the carrier is removed.

FIG. 22 is a schematic view of the semiconductor element 100b shown in FIG. 21 after being disposed on the printed circuit board 192. FIG. 23 is a schematic view of the semiconductor element 100b shown in FIG. 22 after the carrier 110 is removed. As shown in FIG. 22 and FIG. 23, after the semiconductor element 100b is formed, the semiconductor element 100b may be disposed on the printed circuit board 192 through SMT, such that the conductive structure 180 is electrically connected to the printed circuit board 192. SMT may be performed in a reflow oven. Although polluting particles may be formed in a SMT process, the image sensing area 146 is not be polluted due to the carrier 110 covers the image sensing area 146. Afterwards, the adhesion force of the temporary bonding layer 130 may be eliminated to remove the carrier 110 that is on the dam element 120.

Figure 24:
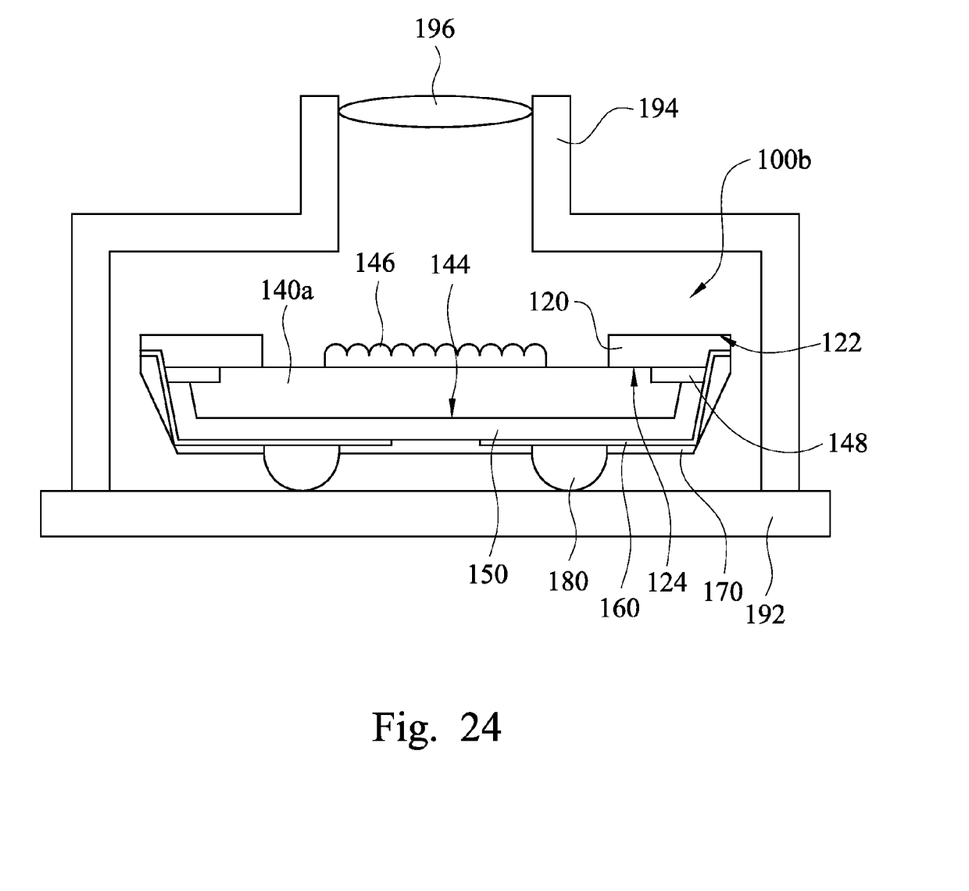
FIG. 24 is a schematic view of the lens assembly after being disposed on the printed circuit board shown in FIG. 23.

FIG. 24 is a schematic view of the lens assembly 194 after being disposed on the printed circuit board 192 shown in FIG. 23. The lens assembly 194 has the light transmissive member 196. After the carrier 110 (see FIG. 22) is removed from the semiconductor element 100b, the lens assembly 194 may be disposed on the printed circuit board 192, such that the semiconductor element 100b without the carrier 110 is located in the lens assembly 194, and the light transmissive member 196 of the lens assembly 194 is aligned with the image sensing area 146 of the chip 140a.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a semiconductor structure, comprising:
   (a) providing a carrier and a dam element, wherein a first surface of the dam element is adhered to the carrier by a temporary bonding layer;
   (b) bonding a second surface of the dam element opposite to the first surface to a third surface of a wafer, such that an image sensing area of the wafer is between the carrier and the dam element;
   (c) forming a first isolation layer, a redistribution layer, a second isolation layer, and a conductive structure in sequence on a fourth surface of the wafer opposite to the third surface;
   (d) dicing the carrier, the dam element, and the wafer to form a semiconductor element;
   (e) disposing the semiconductor element on a printed circuit board, such that the conductive structure is electrically connected to the printed circuit board;
   (f) eliminating an adhesion force of the temporary bonding layer to remove the carrier, by selectively using a heating process, an ultraviolet irradiation process, a laser process, and a chemical immersion process, such that the first surface of the dam element is exposed; and
   (g) disposing a lens assembly having an accommodating space on the printed circuit board, such that the semiconductor element without the carrier is located in the accommodating space of the lens assembly, wherein at least a portion of the accommodating space is present between the first surface of the dam element and the lens assembly, and a light transmissive member of the lens assembly is aligned with the image sensing area.

2. The manufacturing method of the semiconductor structure of claim 1, wherein step (c) further comprises:
   forming a concave hole in the fourth surface of the wafer; and
   forming the patterned first isolation layer on the fourth surface of the wafer and a side wall of the concave hole, such that an electrical pad of the wafer is exposed through the concave hole and the first isolation layer.

3. The manufacturing method of the semiconductor structure of claim 2, wherein step (c) further comprises:
   forming the patterned redistribution layer on the first isolation layer and the electrical pad, such that the redistribution layer is electrically connected to the electrical pad.

4. The manufacturing method of the semiconductor structure of claim 3, wherein step (c) further comprises:
   forming the patterned second isolation layer on the redistribution layer to expose a portion of the redistribution layer; and
   forming the conductive structure on the exposed redistribution layer, such that the conductive structure is electrically connected to the electrical pad.

5. The manufacturing method of the semiconductor structure of claim 2, wherein step (c) further comprises:
   forming a sub concave hole that is communicated with the concave hole in the electrical pad and the dam element.

6. The manufacturing method of the semiconductor structure of claim 5, wherein step (c) further comprises:
forming the patterned redistribution layer on the first isolation layer, the electrical pad and the dam element, such that the redistribution layer is electrically connected to the electrical pad.

7. The manufacturing method of the semiconductor structure of claim 6, wherein step (c) further comprises:
forming the patterned second isolation layer on the redistribution layer to expose a portion of the redistribution layer; and
forming the conductive structure on the exposed redistribution layer, such that the conductive structure is electrically connected to the electrical pad.

8. The manufacturing method of the semiconductor structure of claim 1, further comprising:
etching the wafer to form a recess, such that a side wall of an electrical pad of the wafer is exposed through the recess.

9. The manufacturing method of the semiconductor structure of claim 8, wherein step (c) further comprises:
forming the first isolation layer on the fourth surface of the wafer and the side wall of the electrical pad.

10. The manufacturing method of the semiconductor structure of claim 9, wherein step (c) further comprises:
cutting and removing a portion of the first isolation layer that covers the side wall of the electrical pad to expose the side wall of the electrical pad; and
forming the patterned redistribution layer on the first isolation layer and the side wall of the electrical pad, such that the redistribution layer is electrically connected to the electrical pad.

11. The manufacturing method of the semiconductor structure of claim 10, wherein step (c) further comprises:
forming the patterned second isolation layer on the redistribution layer to expose a portion of the redistribution layer; and
forming the conductive structure on the exposed redistribution layer, such that the conductive structure is electrically connected to the electrical pad.

12. The manufacturing method of the semiconductor structure of claim 1, wherein the conductive structure is a conductive protrusion.

* * * * *